United States Patent
Kon

(10) Patent No.: US 11,495,444 B2
(45) Date of Patent: Nov. 8, 2022

(54) SUBSTRATE PROCESSING APPARATUS AND SUBSTRATE PROCESSING METHOD

(71) Applicant: Tokyo Electron Limited, Tokyo (JP)

(72) Inventor: Masato Kon, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 420 days.

(21) Appl. No.: 16/697,573

(22) Filed: Nov. 27, 2019

(65) Prior Publication Data
US 2020/0176227 A1    Jun. 4, 2020

(30) Foreign Application Priority Data
Nov. 29, 2018 (JP) .............................. JP2018-223891

(51) Int. Cl.
 *H01J 37/32* (2006.01)
 *H01L 21/67* (2006.01)
 *H01L 21/683* (2006.01)

(52) U.S. Cl.
 CPC .. *H01J 37/32642* (2013.01); *H01J 37/32807* (2013.01); *H01J 37/32816* (2013.01); *H01L 21/67069* (2013.01); *H01J 37/32715* (2013.01); *H01J 2237/049* (2013.01); *H01J 2237/334* (2013.01); *H01L 21/6833* (2013.01)

(58) Field of Classification Search
 CPC ........... H01J 37/32642; H01J 37/32807; H01J 37/32816; H01J 2237/049; H01J 2237/334; H01J 37/32715; H01L 21/67069; H01L 21/68735; H01L 21/6833
 See application file for complete search history.

(56) References Cited

U.S. PATENT DOCUMENTS

| 2014/0138029 A1* | 5/2014 | Narita | ..................... A45D 27/46 |
| | | | 156/345.24 |
| 2014/0335698 A1* | 11/2014 | Singh | ................ H01J 37/32715 |
| | | | 438/758 |

FOREIGN PATENT DOCUMENTS

| JP | 2008-244274 A | 10/2008 |
| JP | 2012-036294 A | 2/2012 |
| JP | 2014-220502 A | 11/2014 |

\* cited by examiner

*Primary Examiner* — Yuechuan Yu
(74) *Attorney, Agent, or Firm* — Pearne & Gordon LLP

(57) ABSTRACT

In a processing chamber, a processing target substrate is placed and a substrate processing is performed. A holder is configured to store therein an ionic liquid as some or all of components to be consumed or degraded by the substrate processing within the processing chamber.

17 Claims, 2 Drawing Sheets

SUBSTRATE PROCESSING APPARATUS AND SUBSTRATE PROCESSING METHOD

CROSS-REFERENCE TO RELATED APPLICATION

This application claims the benefit of Japanese Patent Application No. 2018-223891 filed on Nov. 29, 2018, the entire disclosures of which are incorporated herein by reference.

TECHNICAL FIELD

The embodiments described herein pertain generally to a substrate processing apparatus and a substrate processing method.

BACKGROUND

Patent Document 1 describes a technology in which an annular peripheral dielectric member having a greater electrostatic capacitance per unit area than a dielectric member provided under an electrostatic chuck is located under a focus ring and it is relatively difficult for a high frequency power to pass through the peripheral dielectric member and the focus ring.
Patent Document 1: Japanese Patent Laid-open Publication No. 2008-244274

SUMMARY

In one exemplary embodiment, a substrate processing apparatus includes a processing chamber and a holder. In the processing chamber, a processing target substrate is placed and a substrate processing is performed. The holder is configured to store therein an ionic liquid as some or all of components to be consumed or degraded by the substrate processing within the processing chamber.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
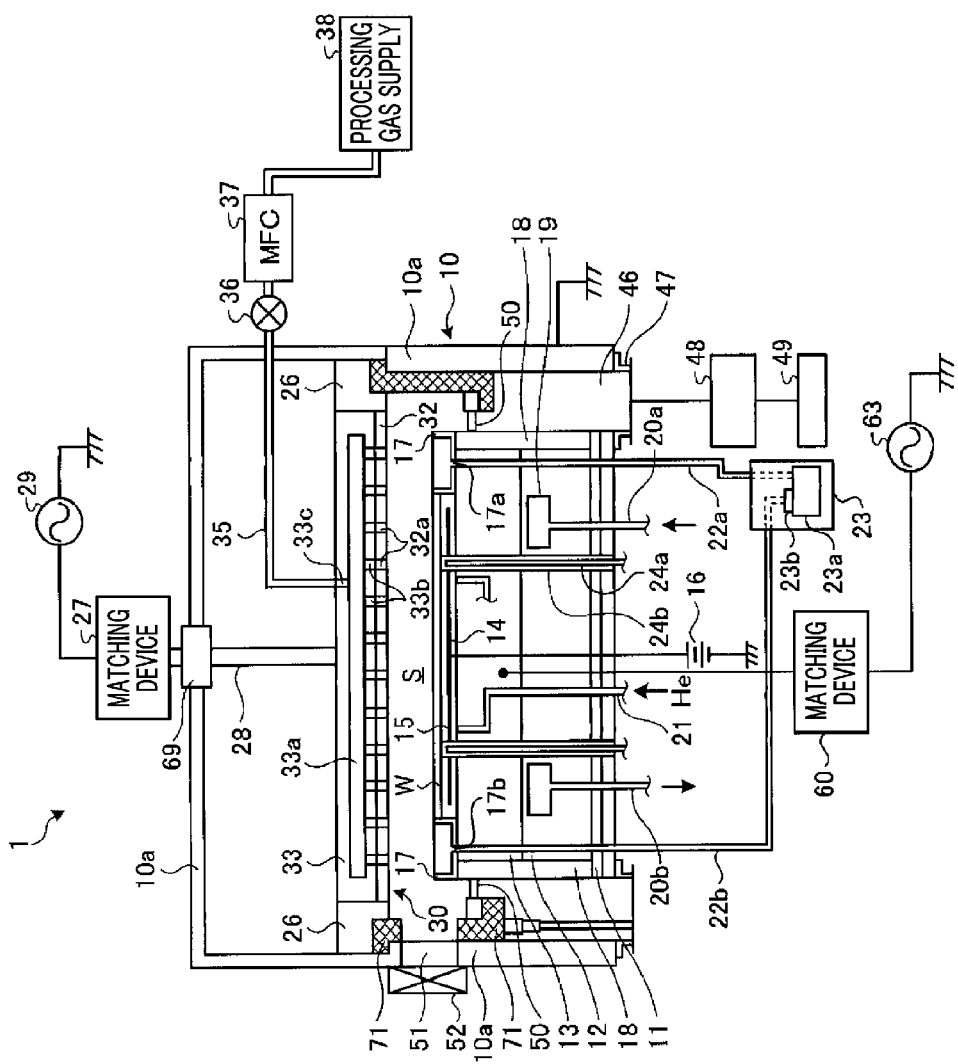
FIG. 1 is a cross-sectional view illustrating a schematic configuration of a substrate processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current embodiment. Still, the embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of a substrate processing apparatus and a substrate processing method of the present disclosure will be described in detail with reference to the accompanying drawings. However, it should be noted that the substrate processing apparatus and the substrate processing method of the present disclosure are not limited to the exemplary embodiments described herein.

There has been known a plasma processing apparatus configured to perform etching processing on a semiconductor wafer (hereafter, also referred to as "wafer") with plasma. In the plasma processing apparatus, while the processing is performed, components within a processing chamber are consumed by the effects of plasma, etching gases, by-products, and the like. For example, a component made of silicon, such as a focus ring, or a component made of quartz may be provided around the wafer in the plasma processing apparatus. The component made of silicon is thinned or changed in surface shape by the etching. The component made of quartz is thinned or softened by the etching and also produces by-products which may be deposited and accumulated to affect the wafer. For this reason, in the plasma processing apparatus, there may be performed a method of restoring a state in the processing chamber by performing dry cleaning or seasoning after processing a predetermined number of wafers. However, even if the state in the processing chamber is restored, the surface shape of the components and the deposition adhesion in the processing chamber cannot be completely recovered. Also, a component which is consumed such as etched to be thinned cannot be recovered. Therefore, the plasma processing apparatus needs to stop the operation thereof and requires maintenance of replacing the consumed component, which leads to a decrease in productivity. Accordingly, a technology capable of reducing the maintenance of replacing the consumed or degraded component is expected.

[Configuration of Substrate Processing Apparatus]

Hereinafter, an example configuration of a substrate processing apparatus according to the present exemplary embodiment will be described. FIG. 1 is a cross-sectional view illustrating a schematic configuration of the substrate processing apparatus according to the exemplary embodiment. In the present exemplary embodiment, a plasma processing apparatus 1 configured to perform plasma etching on a semiconductor wafer W which serves as a processing target substrate will be described as the substrate processing apparatus. However, the substrate processing apparatus is not particularly limited to the plasma processing apparatus 1.

The plasma processing apparatus 1 is configured as a capacitively coupled parallel plate type plasma etching apparatus. The plasma processing apparatus 1 includes a cylindrical processing chamber 10 made of, e.g., aluminum having an alumite-treated (i.e., anodically oxidized) surface. The processing chamber 10 is frame grounded. Further, the plasma processing apparatus 1 is not limited to the capacitively coupled parallel plate type plasma etching apparatus and may be any type of plasma processing apparatus using inductively coupled plasma (ICP), microwave plasma, magnetron plasma, or the like.

A susceptor supporting table 12 having a column shape is placed on a bottom of the processing chamber 10 with an insulating plate 11, such as ceramic, interposed therebetween. A susceptor 13 is placed on the susceptor supporting table 12. The susceptor 13 is formed of a conductive member such as aluminum or the like, and serves as a lower electrode. For example, the semiconductor wafer W as a processing target substrate is placed on the susceptor 13.

An electrostatic chuck 14 is disposed on a top surface of the susceptor 13 to hold the semiconductor wafer W by an electrostatic attracting force. The electrostatic chuck 14 is formed by sandwiching a sheet-type electrode plate 15 made of a conductive film between dielectric layers formed as a pair of dielectric members. The electrode plate 15 is electrically connected to a DC power supply 16 through a connection terminal. The electrostatic chuck 14 attracts and holds the semiconductor wafer W by a Coulomb force or a Johnsen-Rahbek force caused by a DC voltage applied from the DC power supply 16.

Further, the susceptor 13 and the electrostatic chuck 14 include through-holes 24b respectively accommodating pusher pins 24a configured to elevate the semiconductor wafer W in a portion where the semiconductor wafer W is attracted and held. The pusher pins 24a are connected to a motor (not illustrated) through a ball screw (not illustrated) and can be protruded freely from a top surface of the electrostatic chuck 14 by a rotary motion of the motor which is converted into a linear motion by the ball screw. Thus, the pusher pins 24a penetrate the electrostatic chuck 14 and the susceptor 13 and are vertically moved to be protruded therefrom or retracted thereinto. When the semiconductor wafer W is carried into and carried out from the processing chamber 10, the pusher pins 24a are protruded from the electrostatic chuck 14 to lift up the semiconductor wafer W away from the electrostatic chuck 14. When the etching is performed on the semiconductor wafer W, the pusher pins 24a are accommodated in the electrostatic chuck 14.

Figure 2:
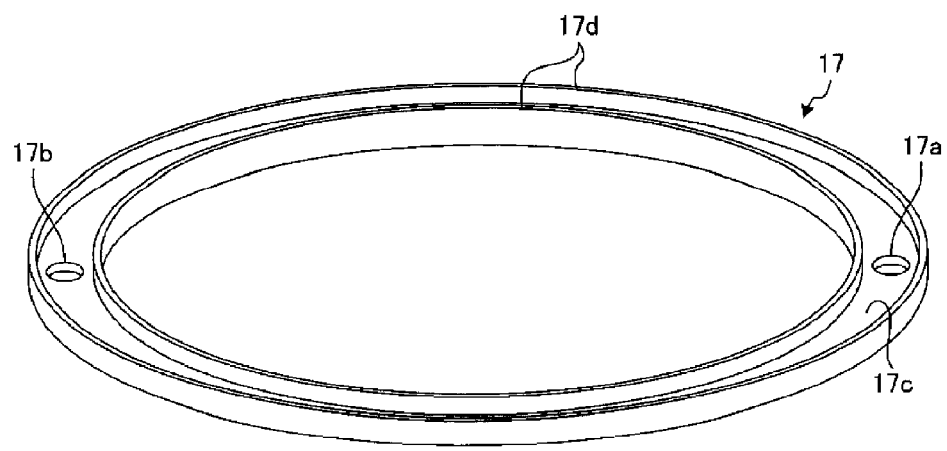
FIG. 2 is a perspective view schematically illustrating an example shape of a container according to an embodiment.

The susceptor 13 is equipped with a holder that stores an ionic liquid. In the present exemplary embodiment, a container 17 as the holder is provided on an upper peripheral portion of the susceptor 13. FIG. 2 is a perspective view schematically illustrating an example shape of the container according to the exemplary embodiment. The container 17 having a circular ring shape has a bottom portion 17c and a side wall 17d with an open top and can store the ionic liquid in an inner space surrounded by the bottom portion 17c and the side wall 17d. The container 17 includes, at the bottom portion 17c, a supply port 17a through which the ionic liquid is supplied and a drain port 17b through which the ionic liquid is drained.

Referring to FIG. 1 again, the plasma processing apparatus 1 is equipped with a mechanism configured to supply and collect the ionic liquid to and from the container 17. In the present exemplary embodiment, the supply port 17a of the container 17 is connected to a line 22a and the drain port 17b of the container 17 is connected to a line 22b. The line 22a and the line 22b are connected to a liquid supply 23. A liquid transport system known in the art may be used as the liquid supply 23. The liquid supply 23 includes a tank 23a configured to store therein the ionic liquid, and supplies the ionic liquid in the tank 23a to the line 22a. The ionic liquid supplied to the line 22a is supplied to the container 17 through the supply port 17a. The ionic liquid of the container 17 is returned from the drain port 17b to the liquid supply 23 through the line 22b to be collected in the tank 23a. That is, the ionic liquid is circulated between the container 17 and the liquid supply 23 through the lines 22a and 22b. The liquid supply 23 is equipped with a filter 23b configured to filter the ionic liquid in a circulation path for the ionic liquid.

In the present embodiment, the liquid supply 23 is located outside the processing chamber 10 and circulates the ionic liquid through the lines 22a and 22b with respect to the container 17 within the processing chamber 10. However, the liquid supply 23 may be located inside the processing chamber 10.

Further, side surfaces of the susceptor 13 and the susceptor supporting table 12 are covered with a cylindrical member 18 made of, e.g., quartz ($SiO_2$). A cooling path 19 extending in, e.g., a circumferential direction is provided within the susceptor supporting table 12. A coolant, such as cooling water, having a predetermined temperature is supplied and circulated from an external chiller unit (not illustrated) through lines 20a and 20b. A processing temperature of the semiconductor wafer W on the susceptor 13 can be controlled by adjusting the temperature of the coolant within the coolant path 19.

Furthermore, the susceptor 13 and the electrostatic chuck 14 are equipped with a gas supply line 21. A heat transfer gas, such as a helium (He) gas, is supplied through the gas supply line 21 from a heat transfer gas supply mechanism (not illustrated). The heat transfer gas is supplied between the top surface of the electrostatic chuck 14 and a rear surface of the semiconductor wafer W through the gas supply line 21, and, thus, heat transfer between the semiconductor wafer W and the susceptor 13 can be controlled uniformly with high efficiency.

An upper electrode 30 is placed above the susceptor 13 and directly faces the susceptor 13. A space formed between the susceptor 13 and the upper electrode 30 serves as a plasma formation space S. An annular insulating shield member 26 made of, e.g., alumina ($Al_2O_3$) or yttria ($Y_2O_3$) is hermetically provided between the upper electrode 30 and a side wall of the processing chamber 10.

Desirably, the upper electrode 30 is made of a semiconductor, e.g., silicon, or a conductor having a low-resistance and low Joule heat. The upper electrode 30 is electrically connected to an upper high frequency power supply 29 via an upper power feed rod 28 and an upper matching device 27. The upper high frequency power supply 29 is configured to output a high frequency voltage of a preset frequency equal to or higher than 13.5 MHz for plasma formation. For example, the upper high frequency power supply 29 outputs the high frequency voltage of 60 MHz. The upper matching device 27 is configured to match a load impedance with an internal impedance of the upper high frequency power supply 29, and control an output impedance of the upper high frequency power supply 29 and the load impedance to be apparently matched with each other when plasma is formed within the processing chamber 10.

The side wall of the processing chamber 10 extends upward to a position higher than the upper electrode 30 to form a cylindrical ground conductor 10a. An upper end of the cylindrical ground conductor 10a is electrically insulated from the upper power feed rod 28 by a cylindrical insulating member 69.

The upper electrode 30 is supported at an upper portion of the processing chamber 10 via the insulating shield member 26. The upper electrode 30 includes an upper electrode plate 32 and an electrode supporting body 33. The upper electrode plate 32 faces the plasma formation space S and includes multiple gas discharge holes 32a. The upper electrode plate 32 is made of a semiconductor, such as silicon or silicon carbide (SiC), or a low-resistance conductor with low Joule heat. A temperature of the upper electrode 30 can be controlled. For example, the upper electrode 30 is equipped with a non-illustrated temperature controller such as a heater to control the temperature thereof.

The electrode supporting body 33 is configured to detachably support the upper electrode plate 32. The electrode supporting body 33 is made of a conductive material such as aluminum having an alumite-treated surface. A gas diffusion space 33a is provided within the electrode supporting body 33. The electrode supporting body 33 includes multiple gas through-holes 33b that respectively communicate with the gas discharge holes 32a and extend downwards from the gas diffusion space 33a. Further, the electrode supporting body 33 includes a gas inlet port 33c through which a processing gas is introduced into the gas diffusion space 33a. The gas inlet port 33c is connected to a gas supply line 35.

The gas supply line 35 is connected to a processing gas source 38 via an opening/closing valve 36 and a mass flow controller (MFC) 37. The processing gas source 38 includes gas sources of various kinds of gases to be used as processing gases for plasma processing and supplies various kinds of gases depending on the kind of the plasma processing to be performed. A gas supplied from the processing gas source 38 reaches the gas diffusion space 33a through the gas supply line 35 to be discharged into the plasma formation space S through the gas through-holes 33b and the gas discharge holes 32a.

An exhaust port 46 is provided at the bottom of the processing chamber 10. The exhaust port 46 is connected to an automatic pressure control valve (hereinafter, referred to as "APC valve") 48 and a turbo molecular pump (hereinafter, referred to as "TMP") 49 via an exhaust manifold 47. The APC valve 48 and the TMP 49 cooperate to decompress the plasma formation space S within the processing chamber 10 to a predetermined decompressed state. Further, an annular baffle plate 50 including multiple through-holes is provided between the exhaust port 46 and the plasma formation space S to surround the susceptor 13. The baffle plate 50 serves to suppress the leakage of plasma from the plasma formation space S into the exhaust port 46.

Further, an opening 51 for carrying-in/carrying-out the semiconductor wafer W is formed at the side wall of the processing chamber 10, and a gate valve 52 for opening or closing the opening 51 is provided. Also, within the processing chamber 10, a substantially cylindrical deposition shield 71 is provided along an inner wall of the processing chamber 10.

The semiconductor wafer W is carried-in/carried-out by opening or closing the gate valve 52. Since the gate valve 52 is provided at an outer side of the processing chamber 10, there is a space in which the opening 51 is protruded toward the atmosphere.

In the plasma processing apparatus 1, the susceptor 13 serving as the lower electrode is electrically connected to a lower high frequency power supply 63 via a lower matching device 60. The lower high frequency power supply 63 is configured to output a high frequency bias voltage of a preset frequency in the range from 2 MHz to 27 MHz for plasma attraction. For example, the lower high frequency power supply 63 outputs the high frequency voltage of 2 MHz. The plasma processing apparatus 1 may also be configured as a lower dual-frequency plasma processing apparatus configured to apply a high frequency voltage of a predetermined frequency for plasma formation to the susceptor 13. The lower matching device 60 is configured to match a load impedance with an internal impedance of the lower high frequency power supply 63. Further, the lower matching device 60 controls the internal impedance of the lower high frequency power supply 63 and the load impedance to be apparently matched with each other when the plasma is formed in the plasma formation space S within the processing chamber 10.

Hereinafter, a sequence of the etching processing performed by the plasma processing apparatus 1 according to the exemplary embodiments will be described briefly.

In the plasma processing apparatus 1, the gate valve 52 is opened. Then, the semiconductor wafer W as the processing target is carried into the processing chamber 10 through the opening 51 by a non-illustrated transfer device, and then, placed on the susceptor 13. In the plasma processing apparatus 1, after the transfer device is retreated, the gate valve 52 is closed.

When the plasma processing apparatus 1 performs the etching processing, the inside of the processing chamber 10 is decompressed to the vacuum state. For example, the plasma processing apparatus 1 operates the TMP 49 to decompress the inside of the processing chamber 10 to a predetermined decompressed state. Further, the plasma processing apparatus 1 applies the DC voltage from the DC power supply 16 to the electrode plate 15 of the electrostatic chuck 14 to electrostatically attract and hold the semiconductor wafer W on the susceptor 13.

The plasma processing apparatus 1 supplies the processing gases used for the etching processing from the processing gas source 38 into the processing chamber 10 at predetermined flow rates with a preset flow rate ratio. Further, the plasma processing apparatus 1 applies the high frequency power of, e.g., 60 MHz for plasma formation from the upper high frequency power supply 29 to the upper electrode 30 at a predetermined power level. Furthermore, the plasma processing apparatus 1 applies the high frequency power of, e.g., 2 MHz for bias from the lower high frequency power supply 63 to the lower electrode as the susceptor 13 at a predetermined power level. Thus, the plasma is formed in the plasma formation space S between the upper electrode 30 and the susceptor 13. Herein, ions in the plasma are attracted toward the semiconductor wafer W by the high frequency power from the lower high frequency power supply 63. Thus, the semiconductor wafer W is etched.

In a conventional plasma processing apparatus, a component made of silicon or a component made of quartz may be provided around a semiconductor wafer. For example, in the plasma processing apparatus disclosed in Patent Document 1, a silicon focus ring is provided around a wafer. Since the focus ring is provided around the wafer in the plasma processing apparatus, plasma around the wafer is uniform. Thus, etching characteristics on the entire surface of the wafer can be uniform. However, the component made of silicon such as the focus ring can be thinned or changed in the surface shape by the etching. The component made of quartz can be thinned or softened by the etching and also produces by-products which may be deposited and accumulated to affect the wafer. For this reason, in the plasma processing apparatus, there may be performed a method of restoring the state in the processing chamber by performing dry cleaning or seasoning after processing a predetermined number of wafers. However, even if the state in the processing chamber is restored, the surface shape of the components and the deposition adhesion in the processing chamber cannot be completely recovered. Also, a component which is consumed such as etched to be thinned cannot be recovered. Therefore, the plasma processing apparatus needs to stop the operation thereof and requires the maintenance of replacing the consumed component, which leads to the decrease in productivity.

Accordingly, the ionic liquid is used as an alternative to the silicon component or the quartz component to be consumed in the etching processing. For example, the plasma processing apparatus 1 includes the holder that stores the ionic liquid as some or all of the components to be consumed or degraded by the etching processing in the processing chamber 10. In the present embodiment, instead of the focus ring, the container 17 is provided around the semiconductor wafer W, and the ionic liquid is stored in the container 17. Thus, in the plasma processing apparatus 1, the ionic liquid can suppress the consumption or the degradation of the component which is consumed or degraded by the etching processing. Therefore, it is possible to reduce the maintenance of replacing the component which has been consumed or degraded by the etching Processing.

[Example of Ionic Liquid]

The ionic liquid is a salt which is a liquid at the room temperature and composed of only ions. The ionic liquid has a property such as low vapor pressure of almost zero, non-volatility (not volatile even at the high temperature and in the vacuum atmosphere), high ionic conductivity, high thermal conductivity, very high thermal stability, fire-resistance, and the like. Further, the ionic liquid can be classified into hydrophilic ionic liquid and hydrophobic ionic liquid, and have high polarity. Since the ionic liquid is a liquid, the ionic liquid can be flown to be supplied into the processing chamber 10 through the lines 22a and 22b. Further, even if the ionic liquid is consumed during the etching processing, the state in the plasma processing apparatus 1 can be restored by replenishing the ionic liquid through the lines 22a and 22b. Thus, there is no need to stop the operation of the plasma processing apparatus 1 for the replacement. Therefore, the productivity of the plasma processing apparatus 1 can be increased. Further, since a circulatory filter system or an exchange system is applied, even if the ionic liquid is degraded, a non-degraded ionic liquid can be supplied without opening the processing chamber 10. Therefore, the production can be maintained. Furthermore, the ionic liquid is conductive and thus can also be used in a place where the conductivity is required.

The ionic liquid is non-volatile even in the vacuum atmosphere and thus can remain in the liquid state in the vacuum atmosphere within the processing chamber 10. Therefore, in the plasma processing apparatus 1, the semiconductor wafer W being transferred within the processing chamber 10 is free from adhesion of a volatile component or decomposition product of the ionic liquid. Also, the ionic liquid used herein may be hydrophobic, and water-insoluble and non-reactive with water (moisture).

Since the ionic liquid is hydrophobic, and water-insoluble and non-reactive with water, it is possible to suppress the permeation of water into the ionic liquid. Here, if water permeates into the ionic liquid, when the processing chamber 10 is exhausted to a vacuum state, the water in the ionic liquid may be released to the vacuum atmosphere, which may affect a vacuum level in the processing chamber 10. For this reason, the ionic liquid is desirably hydrophobic and also desirably water-insoluble and non-reactive with water. Accordingly, it is possible to suppress the decrease of the vacuum level in the processing chamber 10.

Further, the ionic liquid is desirably liquid in a temperature range from the room temperature to a temperature for plasma processing. In order to properly ensure an optimal range (process window) for manufacturing conditions, it is desirable to use an ionic liquid with as low a melting point as possible and as high a boiling point as possible.

As for the optimal ionic liquid, at least one of, e.g., thiosalicylic acid methyltrioctylammonium, bis(2-ethylhexyl)phosphoric acid trihexyltetradecylphosphonium, methyltrioctylammonium bis(trifluoromethylsulfonyl) imide, 1-ethyl-3-methylimidazolium bis(trifluoromethylsulfonyl)imide, 1-butyl-3-methylimidazolium bis(trifluoromethylsulfonyl)imide, 1-hexyl-3-methylimidazolium bis(trifluoromethylsulfonyl)imide, or 1-methyl-1-propylpyrrolidinium bis(trifluoromethylsulfonyl)amide may be used.

Such an ionic liquid can be substituted for a part on a horizontal plane. In the plasma processing apparatus 1 according to the present exemplary embodiment, the ionic liquid is stored in the container 17 and substituted for the focus ring. It is desirable to fill the ionic liquid up to near an upper end of the side wall 17d of the container 17, and an interface of the ionic liquid may be higher than the upper end of the side wall 17d by the surface tension. Thus, the plasma processing apparatus 1 may use the ionic liquid instead of the focus ring. Therefore, it is possible to reduce the maintenance operations.

Further, the plasma processing apparatus 1 is configured to supply the ionic liquid into the container 17 from the liquid supply 23 via the line 22a and the supply port 17a. The liquid supply 23 replenishes the container 17 with the ionic liquid as the ionic liquid is consumed during the plasma processing. Thus, in the plasma processing apparatus 1, even if the ionic liquid is consumed, the ionic liquid can be replenished. Therefore, it is possible to reduce the maintenance of replenishing the container 17 with the ionic liquid.

Furthermore, the plasma processing apparatus 1 is configured to collect the ionic liquid into the liquid supply 23 from the container 17 through the line 22b and the drain port 17b. Thus, in the plasma processing apparatus 1, the ionic liquid in which foreign materials such as particles or by-products generated during the etching processing are mixed can be collected from the container 17.

The liquid supply 23 is equipped with the filter 23b configured to filter the ionic liquid in the circulation path for the ionic liquid. The liquid supply 23 filters the collected ionic liquid through the filter 23b and supplies the filtered ionic liquid again to the container 17. Thus, in the plasma processing apparatus 1, the foreign materials mixed into the ionic liquid can be removed by the filter 23b. Therefore, the collected ionic liquid can be reused efficiently.

The liquid supply 23 may supply and collect the ionic liquid or recover (circulate) the ionic liquid while supplying the ionic liquid during the etching processing. Thus, in the plasma processing apparatus 1, even if the ionic liquid is degraded during the etching processing, the ionic liquid of high quality can be supplied continuously. Therefore, the process conditions can be maintained uniform. Meanwhile, the liquid supply 23 may supply and collect the ionic liquid or collect (circulate) the ionic liquid while supplying the ionic liquid other than the timing of the etching processing. Thus, in the plasma processing apparatus 1, it is possible to suppress the etching processing from being adversely affected by the transfer of the ionic liquid during the etching processing.

Meanwhile, the ionic liquid may be degraded. When the ionic liquid is degraded, its color and electrical characteristics may change. For example, when the ionic liquid is degraded, its color may change, so that the transmittance thereof is decreased or its ionic conductivity may change.

Accordingly, the liquid supply 23 may be equipped with a detector configured to detect the color or the electrical characteristics of the ionic liquid. When the detector detects the color or the electrical characteristics of the ionic liquid, the liquid supply 23 may determine whether the ionic liquid is degraded based on at least one of the change in the color of the ionic liquid or the change in the electrical characteristics of the ionic liquid. For example, if the transmittance of the ionic liquid is decreased by a predetermined level or more or if the ionic conductivity of the ionic liquid is changed by a predetermined level or more, the liquid supply 23 may determine that the ionic liquid has been degraded. When the ionic liquid is determined as being degraded, the plasma processing apparatus 1 may notify the degradation of the ionic liquid to the manager or the like. Then, the ionic liquid is replaced.

Further, the liquid supply 23 may be equipped with a temperature controller such as a heater. The ionic liquid may be controlled to a predetermined temperature by the temperature controller, and then, circulated. Thus, in the plasma processing apparatus 1, etching conditions can be maintained uniform during the process or can be changed depending on the process by controlling the temperature of the ionic liquid. Therefore, it is possible to increase the degree of freedom of the process.

In the present embodiment, the liquid supply 23 is located outside the processing chamber 10 and circulates the ionic liquid through the lines 22a and 22b with respect to the container 17 within the processing chamber 10. However, the liquid supply 23 may be located inside the processing chamber 10. If the liquid supply 23 is located inside the processing chamber 10, the pressure difference from the outside does not need to be considered. However, in the plasma processing apparatus 1, the processing chamber 10 needs to be opened during the maintenance of replenishing or collecting the ionic liquid into or from the tank 23a. In this case, a cycle of the maintenance can be lengthened by increasing the amount of the ionic liquid stored and preserved in the tank 23a.

As in the present exemplary embodiment, the liquid supply 23 may be located outside the processing chamber 10, and, thus, the ionic liquid can be replenished and collected into and from the tank 23a without opening the processing chamber 10.

As stated above, the plasma processing apparatus 1 according to the present exemplary embodiment includes the processing chamber 10 and the holder. In the processing chamber 10, the semiconductor wafer W is placed and a substrate processing is performed. The holder is configured to store therein the ionic liquid as some or all of components to be consumed or degraded by the substrate processing within the processing chamber 10. Therefore, the plasma processing apparatus 1 may reduce the maintenance operations.

In the plasma processing apparatus 1, the processing chamber 10 is in a vacuum state during the substrate processing. The plasma processing apparatus 1 further includes a mechanism (lines 22a and 22b, liquid supply 23) configured to perform at least one of supplying or collecting the ionic liquid with respect to the holder. Therefore, the plasma processing apparatus 1 may replenish the ionic liquid even when the ionic liquid is consumed and thus can omit maintenance of replenishing the ionic liquid into the holder. Also, the plasma processing apparatus 1 may recover, from the container 17, the ionic liquid in which foreign materials such as particles or by-products generated during the etching processing are mixed.

The liquid supply 23 is equipped with a filter configured to filter the ionic liquid, and filters the ionic liquid collected from the holder by the filter to supply the filtered ionic liquid into the holder. Therefore, the plasma processing apparatus 1 may remove the foreign materials mixed in the ionic liquid through the filter 23b and reuse the recovered ionic liquid efficiently.

The liquid supply 23 is located outside the processing chamber 10. Therefore, the plasma processing apparatus 1 may replenish or recover the ionic liquid into or from the tank 23a without opening the processing chamber 10.

The liquid supply 23 is configured to determine whether the ionic liquid is degraded based on at least one of a change in color of the ionic liquid or a change in electrical characteristics of the ionic liquid. Therefore, the plasma processing apparatus 1 may determine whether the ionic liquid is degraded.

The holder is the container 17 provided around the semiconductor wafer W and equipped with an open top, and stores therein the ionic liquid. Therefore, the plasma processing apparatus 1 may include the ionic liquid, instead of a focus ring, located around the semiconductor wafer W.

The ionic liquid is hydrophobic. Therefore, it is possible to suppress the permeation of water into the ionic liquid.

The ionic liquid is water-insoluble and non-reactive with water. Therefore, it is possible to suppress the permeation of water in the ionic liquid.

The ionic liquid is at least one of thiosalicylic acid methyltrioctylammonium, bis(2-ethylhexyl)phosphoric acid trihexyltetradecylphosphonium, methyltrioctylammonium bis(trifluoromethylsulfonyl)imide, 1-ethyl-3-methylimidazolium bis(trifluoromethylsulfonyl)imide, 1-butyl-3-methylimidazolium bis(trifluoromethylsulfonyl)imide, 1-hexyl-3-methylimidazolium bis(trifluoromethylsulfonyl)imide, or 1-methyl-1-propylpyrrolidinium bis(trifluoromethylsulfonyl)amide. Therefore, the plasma processing apparatus 1 may replace and use the ionic liquid for a component to be consumed or degraded.

The exemplary embodiments described herein are illustrative and not limited thereto. In fact, the above exemplary embodiments can be embodied in various forms. Further, the above-described exemplary embodiments may be omitted, substituted, or changed in various forms without departing from the scope of the appended claims.

For example, in the above-described exemplary embodiments, the semiconductor wafer has been described as the processing target substrate, but is not limited thereto. A glass substrate or other substrate may be used as the processing target substrate.

Further, in the above-described exemplary embodiments, the plasma processing apparatus 1 has been described as the substrate processing apparatus to perform the plasma etching as the substrate processing, but is not limited thereto. Any type of substrate processing apparatus may be used as long as it can perform the substrate processing configured to consume or degrade the component within a processing chamber.

Furthermore, in the above-described exemplary embodiments, the focus ring has been described as the component to be consumed or degraded, but is not limited thereto. Any component to be consumed or degraded may be applied thereto. For example, the plasma processing apparatus may include a cover ring located around the focus ring and configured to protect a side portion of the focus ring. For example, the ionic liquid may be used instead of the cover ring.

Moreover, in the above-described exemplary embodiments, the holder configured to store therein the ionic liquid has been described as being substituted with all of the components to be consumed or degraded, but is not limited thereto. The holder that stores the ionic liquid may be substituted with some of the components to be consumed or degraded.

According to the embodiments, it is possible to reduce maintenance operations.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:
   a processing chamber in which a processing target substrate is placed and a substrate processing is performed; and
   a holder configured to store therein an ionic liquid,
   wherein the holder is a container provided around the substrate and equipped with a bottom portion, an inner side wall and an outer side wall, and an inner space surrounded by the bottom portion and the inner and outer side walls is configured to store therein the ionic liquid, and
   the inner space between the inner and outer side walls has an entirely open top.

2. The substrate processing apparatus of claim 1, further comprising:
   a mechanism configured to perform at least one of supplying or collecting the ionic liquid with respect to the holder,
   wherein the processing chamber is in a vacuum state during the substrate processing.

3. The substrate processing apparatus of claim 2,
   wherein the mechanism is equipped with a filter configured to filter the ionic liquid, and filters the ionic liquid collected from the holder by the filter to supply the filtered ionic liquid into the holder.

4. The substrate processing apparatus of claim 2,
   wherein the mechanism is located inside the processing chamber.

5. The substrate processing apparatus of claim 2,
   wherein the mechanism is located outside the processing chamber.

6. The substrate processing apparatus of claim 2,
   wherein the mechanism is configured to determine whether the ionic liquid is degraded based on at least one of a change in color of the ionic liquid or a change in electrical characteristics of the ionic liquid.

7. The substrate processing apparatus of claim 1,
   wherein the substrate processing is an etching processing of etching a substrate with plasma formed while supplying a processing gas into the processing chamber.

8. The substrate processing apparatus of claim 1,
   wherein the ionic liquid is hydrophobic.

9. The substrate processing apparatus of claim 1,
   wherein the ionic liquid is water-insoluble and non-reactive with water.

10. The substrate processing apparatus of claim 1,
    wherein the ionic liquid is at least one of:
    thiosalicylic acid methyltrioctylammonium, bis(2-ethylhexyl)phosphoric acid trihexyltetradecylphosphonium, methyltrioctylammonium bis(trifluoromethylsulfonyl)imide, 1-ethyl-3-methylimidazolium bis(trifluoromethylsulfonyl)imide, 1-butyl-3-methylimidazolium bis(trifluoromethylsulfonyl)imide, 1-hexyl-3-methylimidazolium bis(trifluoromethylsulfonyl)imide, or 1-methyl-1-propylpyrrolidinium bis(trifluoromethylsulfonyl)amide.

11. The substrate processing apparatus of claim 3,
    wherein the mechanism is located inside the processing chamber.

12. The substrate processing apparatus of claim 11,
    wherein the mechanism is configured to determine whether the ionic liquid is degraded based on at least one of a change in color of the ionic liquid or a change in electrical characteristics of the ionic liquid.

13. The substrate processing apparatus of claim 12,
    wherein the substrate processing is an etching processing of etching a substrate with plasma formed while supplying a processing gas into the processing chamber.

14. The substrate processing apparatus of claim 1,
    wherein the ionic liquid is hydrophobic.

15. The substrate processing apparatus of claim 14,
    wherein the ionic liquid is water-insoluble and non-reactive with water.

16. The substrate processing apparatus of claim 15,
    wherein the ionic liquid is at least one of:
    thiosalicylic acid methyltrioctylammonium, bis(2-ethylhexyl)phosphoric acid trihexyltetradecylphosphonium, methyltrioctylammonium bis(trifluoromethylsulfonyl)imide, 1-ethyl-3-methylimidazolium bis(trifluoromethylsulfonyl)imide, 1-butyl-3-methylimidazolium bis(trifluoromethylsulfonyl)imide, 1-hexyl-3-methylimidazolium bis(trifluoromethylsulfonyl)imide, or 1-methyl-1-propylpyrrolidinium bis(trifluoromethylsulfonyl)amide.

17. A substrate processing method, comprising:
    storing an ionic liquid in a holder within a processing chamber in which a processing target substrate is placed and a substrate processing is performed;
    performing the substrate processing within the processing chamber; and
    replenishing the ionic liquid into the holder as the ionic liquid is consumed by the substrate processing,
    wherein the holder is a container provided around the substrate and equipped with a bottom portion, an inner side wall and an outer side wall, and an inner space surrounded by the bottom portion and the inner and outer side walls stores therein the ionic liquid, and
    the inner space between the inner and outer side walls has an entirely open top.

* * * * *